United States Patent [19]
Leibovitz et al.

[11] Patent Number: 6,146,984
[45] Date of Patent: Nov. 14, 2000

[54] METHOD AND STRUCTURE FOR UNIFORM HEIGHT SOLDER BUMPS ON A SEMICONDUCTOR WAFER

[75] Inventors: Jacques Leibovitz, San Jose; Susan J. Swindlehurst, Redwood City, both of Calif.

[73] Assignee: Agilent Technologies Inc., Palo Alto, Calif.

[21] Appl. No.: 09/415,319

[22] Filed: Oct. 8, 1999

[51] Int. Cl.[7] ................................................ H01L 21/44
[52] U.S. Cl. ...................... 438/613; 438/614; 438/678; 438/926
[58] Field of Search ..................................... 438/612, 613, 438/614, 615, 678, 926; 257/737, 738

[56] References Cited

U.S. PATENT DOCUMENTS

| | | | |
|---|---|---|---|
| 5,391,285 | 2/1995 | Lytle et al. | 205/123 |
| 5,508,229 | 4/1996 | Baker | 438/613 |
| 5,670,034 | 9/1997 | Lowery | 205/143 |
| 5,763,057 | 6/1998 | Sawada et al. | 428/209 |
| 5,767,010 | 6/1998 | Mis et al. | 438/614 |
| 5,903,058 | 5/1999 | Akram | 257/778 |
| 5,981,314 | 11/1999 | Glenn et al. | 438/127 |
| 6,077,765 | 6/2000 | Naya | 438/614 |
| 6,080,650 | 6/2000 | Edwards | 438/612 |
| 6,085,968 | 7/2000 | Swindlehurst et al. | 228/254 |

*Primary Examiner*—T. N. Quach

[57] ABSTRACT

Uniform height solder bumps are created on a semiconductor wafer by exposing a dummy pattern of under bump metal for solder plating. The dummy pattern of exposed under bump metal follows the outer edge outline of a pattern of die that exists on the semiconductor wafer. The dummy pattern of under bump metal is exposed by removing a portion of a layer of photoresist that is deposited over the under bump metal. The dummy pattern of under bump metal is exposed on the wafer at the same time that under bump metal above the contact pads is exposed. Solder material is then plated onto the exposed under bump metal that exists above the contact pads and in the dummy pattern. The dummy pattern of exposed under bump metal around the outer edge of the die pattern causes current crowding to occur primarily at the dummy pattern of exposed under bump metal instead of at the contact pads that are on die at the outer edge of the die pattern. Because current crowding occurs primarily at the dummy pattern of exposed under bump metal instead of at the exposed under bump metal above the contact pads of the outer edge die, the plating current density across the die pattern is more uniform, thereby producing solder bumps having a more uniform height.

14 Claims, 4 Drawing Sheets

METHOD AND STRUCTURE FOR UNIFORM HEIGHT SOLDER BUMPS ON A SEMICONDUCTOR WAFER

FIELD OF THE INVENTION

The present invention relates in general to semiconductor device fabrication, and more particularly to the uniform plating of conductive bumps on the surface of a semiconductor wafer.

BACKGROUND OF THE INVENTION

The increasing complexity and shrinking size of integrated circuit devices has created a need for each device to have a larger number of input/output points (I/Os). Flip chip technology is being utilized to allow more input/output I/Os on an integrated circuit device. Flip chip technology utilizes solder bumps instead of wires to connect contact pads on an integrated circuit (IC) device to contact pads on an IC package or to contact pads on a circuit board.

Solder bumps are created on IC devices while the IC devices, also referred to as die, are still on a semiconductor wafer. FIG. 1 is a depiction of a semiconductor wafer 102 that includes multiple die that are similar to the uppermost and leftmost die 104. The process of creating the solder bumps begins after contact pads have been formed on the top surface of the semiconductor wafer. In one known technique, after the contact pads have been formed, an under bump metal layer is deposited on top of the semiconductor wafer (including the contact pads) and covered with a protective layer of photoresist. The under bump metal layer is placed on top of the semiconductor wafer because the solder material that is used to form the solder bumps does not readily adhere to the contact pads. The protective layer of photoresist is then patterned and removed in the areas above the contact pads utilizing known photolithographic processes. Removing portions of the photoresist in the areas above the contact pads exposes the under bump metal layer that is above the contact pads. Once the under bump metal layer is exposed above the contact pads, solder material is formed over the exposed portions of the under bump layer. One technique for depositing solder material onto a semiconductor wafer involves electroplating the solder material onto the exposed portions of the under bump metal layer. Once the solder material is plated onto the exposed under bump metal layer, the protective layer of photoresist and the unneeded portions of the under bump metal layer are removed. The plated solder material subsequently is put through a reflow process that forms the solder material into smooth solder bumps.

In order to connect the solder bumps to an IC package or to a circuit board, it is important that the solder bumps are formed with a uniform height across a semiconductor wafer. It is hard to electroplate solder bumps of uniform height all the way across a wafer. One problem with electroplating that contributes to solder bumps being formed at a non-uniform height is the uneven distribution of plating current density across a wafer. The uneven distribution of plating current density causes a thicker layer of solder to be plated over areas where the current density is higher and a thinner layer of solder to be plated over areas where the current density is lower.

Because of the current flow characteristics around a wafer, current density is typically higher around the outer edge of the pattern of die that is present on a semiconductor wafer. Crowding of current lines occurs around the outer edge of the pattern of die and creates a thicker plating layer on the die at the outer edge of the pattern of die. The creation of a thicker plating layer around the outer edge of the pattern of die, known as an "edge effect," results in solder bumps that are not uniform in height across a semiconductor wafer. When solder bumps fall outside of acceptable height range boundaries, the affected die on a wafer must be reworked or scrapped, reducing the efficiency of the production process. The edge effect can occur on a per wafer basis, such that solder bump height varies across a wafer, and on a per die basis, such that solder bump height varies across the surface of a single die.

One technique that has been considered to counteract the edge effect that is experienced when electroplating solder material onto semiconductor wafers involves continuing the IC layout pattern to the edge of the wafer. For example, FIG. 2 depicts a semiconductor wafer 202 that has an IC layout pattern that includes die that continue to the edge of the semiconductor wafer. Each complete square on the semiconductor wafer represents a complete die (e.g., die 204) and each partial square on the semiconductor wafer represents a partial die (e.g., 206). During processing of the semiconductor wafer, the under bump metal layer and the solder bumps are deposited out to the edge of the wafer in a repeating pattern. Because the solder bumps are deposited out to the edge of the semiconductor wafer, the edge effect is experienced by the outer lying die. As a result, the outer lying die exhibit some thicker solder plating while the inner die experience more uniform thickness of solder plating. However, because the outer lying die are usually only portions of complete die, the outer lying die are scrapped regardless of solder bump height. Although extending the IC layout pattern out to the edge of the semiconductor wafer may work well to minimize the number of complete die that are subjected to the edge effect, it can create other wafer handling and processing problems.

In view of the increased reliance on flip chip technology, there exists a need for a technique that allows solder bumps of uniform height to be plated onto a semiconductor wafer.

SUMMARY OF THE INVENTION

A method and structure that are utilized to create uniform height solder bumps on a semiconductor wafer include an under bump metal layer that is exposed above contact pads and in a dummy pattern around the outer edge outline of a pattern of die that exists on the semiconductor wafer. Exposing a dummy pattern of under bump metal around the outer edge outline of the pattern of die causes current crowding to occur primarily at the dummy pattern of exposed under bump metal instead of at the outer edge die. Because current crowding occurs primarily at the dummy pattern of exposed under bump metal instead of the outer edge die, the plating current density across the die pattern is more uniform, thereby producing solder bumps having a more uniform height.

In an embodiment, a UBM layer is deposited onto the top layer of the semiconductor wafer. Because the contact pads are exposed, the UBM layer comes into direct contact with the contact pads. After the UBM layer is deposited onto the semiconductor wafer, a layer of photoresist is deposited over the UBM layer. Utilizing known photolithographic processes, selected portions of the layer of photoresist are then removed from above the contact pads and in a dummy pattern around the outer edge outline of the pattern of die. Once the photoresist is removed from above the contact pads and in the dummy pattern, the UBM layer is exposed to ambient conditions in the areas above the contact pads and in the dummy pattern.

After the under bump metal layer is exposed in the areas above the contact pads and in the dummy pattern, solder material is electroplated onto the exposed under bump metal layer in order to form solder bumps above the contact pads. Specifically, the solder material is simultaneously electroplated onto the exposed under bump metal that is above the contact pads and onto the dummy pattern of exposed under bump metal. Next, the photoresist is removed and then the under bump metal that is not covered by plated solder is selectively etched from the semiconductor wafer. After the under bump metal is selectively etched, the plated solder material is put through a reflow process to create smooth solder bumps over the contact pads. In an alternative embodiment, the solder reflow may occur before the selective etching of the under bump metal.

After the solder bumps have been created on the surface of the semiconductor wafer, the semiconductor wafer may be cut into individual die. After the semiconductor wafer is cut, the portions of the wafer that include the dummy pattern of under bump metal and plated solder material are discarded. Because the dummy pattern of under bump metal is outside the pattern of die, it serves no purpose after the solder bumps have been created.

An embodiment of the dummy pattern of exposed under bump metal includes a continuous strip of under bump metal that is defined by the outer edge outline of the pattern of die. In an embodiment, the continuous strip of exposed under bump metal is parallel to the outer edge outline of the pattern of die. In another embodiment of the dummy pattern, the exposed under bump metal is segmented such that the dicing streets are clear of any exposed under bump metal. Keeping the dicing streets clear of exposed under bump metal makes it easier to cut the semiconductor wafer after the solder material has been plated onto the exposed under bump metal.

Because the dummy pattern of exposed under bump metal is located around the outer edge outline of the pattern of die, during the electroplating process, current crowding occurs at the dummy pattern and not at the contact pads of the outer edge die. Current crowding at the dummy pattern causes a thicker layer of solder material to be plated onto the dummy pattern of the exposed under bump metal layer. Because current crowding occurs at the dummy pattern instead of at the outer die, a relatively uniform current density is created across the die pattern. As a result of the relatively uniform current density across the die pattern, a relatively uniform layer of solder material is plated over the entire die pattern, even over the die at the outer edge of the die pattern.

DETAILED DESCRIPTION OF THE INVENTION

Figure 1:
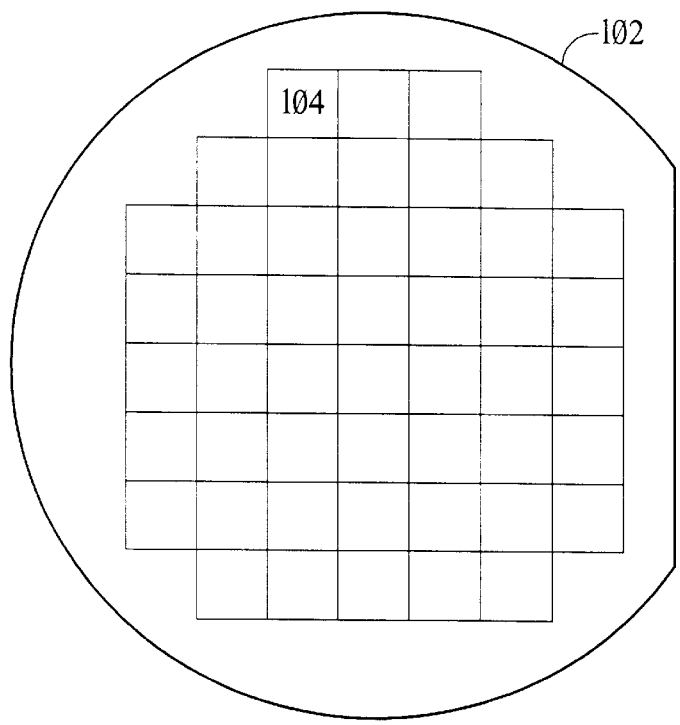
FIG. 1 is a plan view of a semiconductor wafer that includes a die pattern having only complete die, as is known in the prior art.
Figure 2:
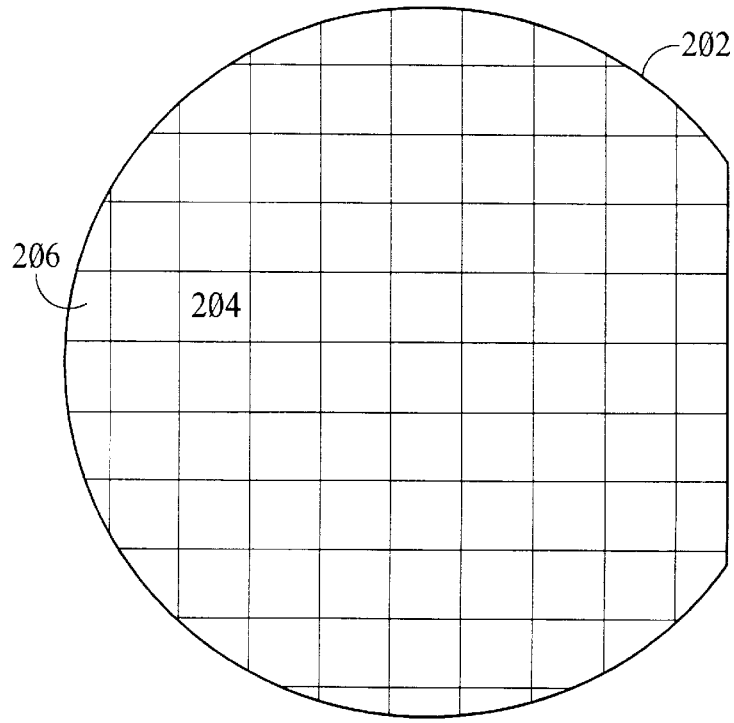
FIG. 2 is a plan view of a semiconductor wafer that includes a die pattern that extents to the edge of the semiconductor wafer, as is known in the prior art.
Figure 3:
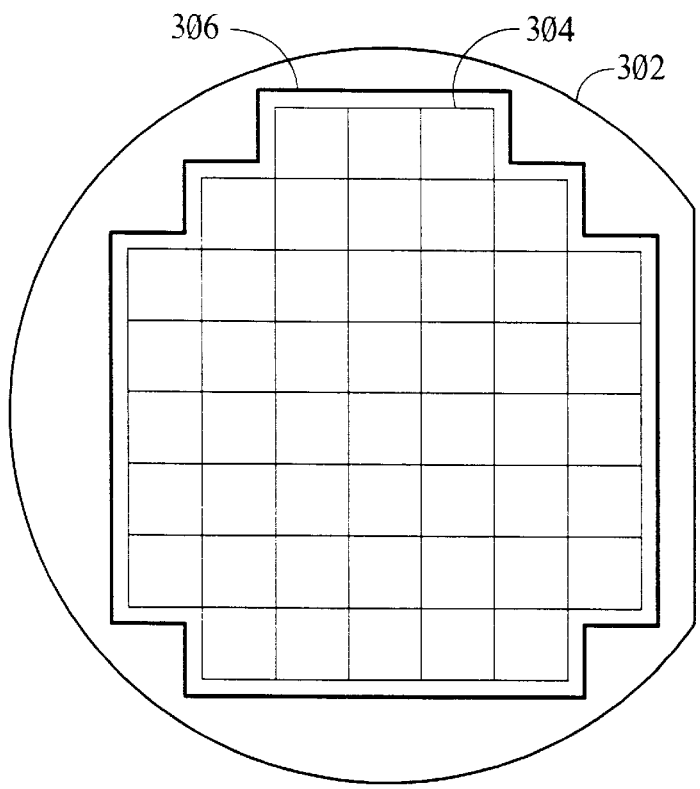
FIG. 3 is a plan view of a semiconductor wafer that includes an under bump metal layer formed in a dummy pattern around the outline of the pattern of die, in accordance with the invention.

FIG. 3 is a plan view of a pattern of die 304 on a semiconductor wafer 302 that includes an under bump metal (UBM) layer exposed in a dummy pattern 306 around the outline of the pattern of die. Exposing a dummy pattern of the UBM layer around the outline of the pattern of die causes current crowding to occur primarily at the dummy pattern of UBM instead of at the outer edge die. Because current crowding occurs primarily at the dummy pattern of the UBM layer instead of the outer edge die, the plating current density across the die area is more uniform, thereby producing solder bumps of a more uniform height.

Figure 4:
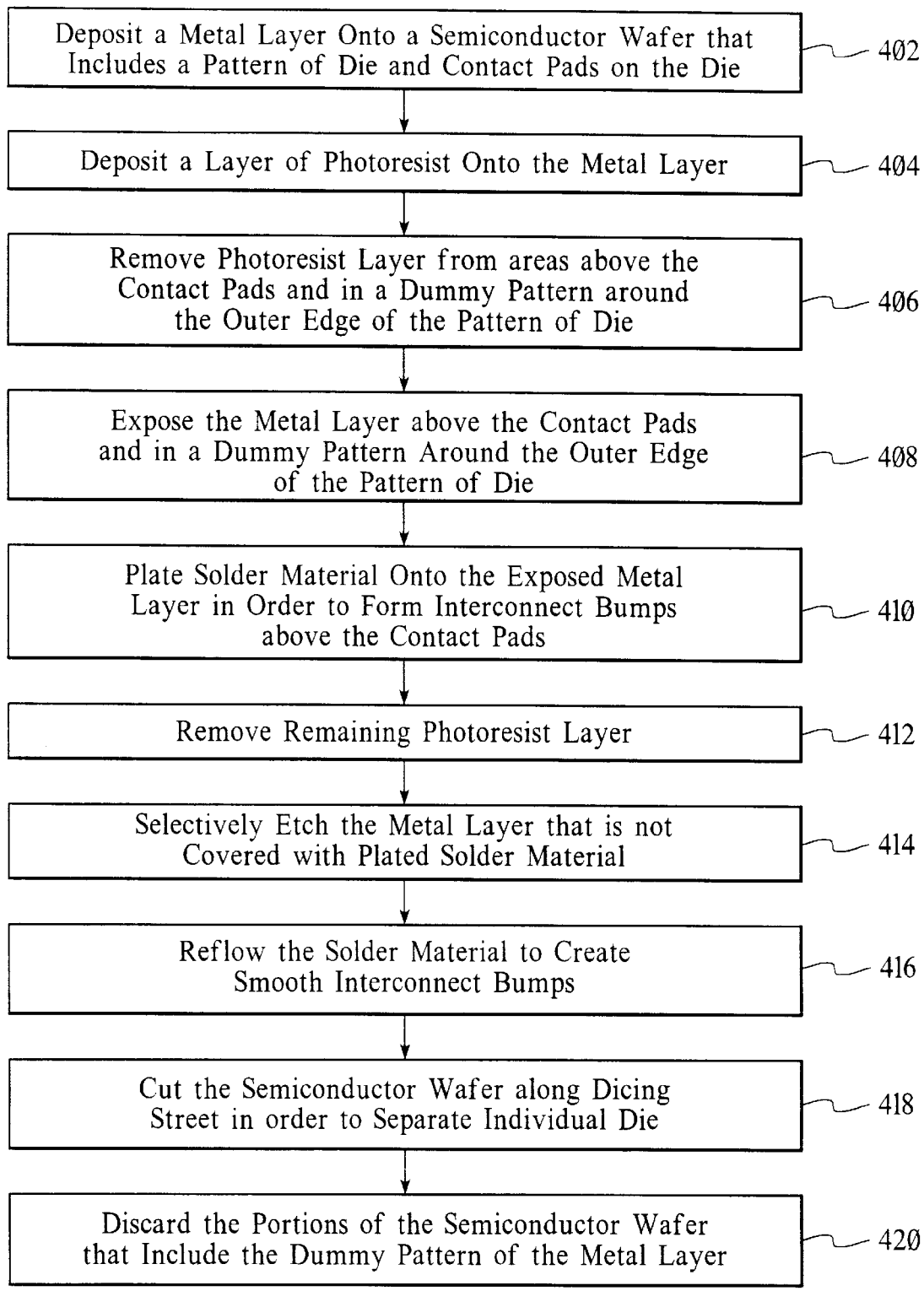
FIG. 4 is a process flow diagram of a preferred method for forming solder bumps of uniform height, in accordance with the invention.

FIG. 4 is a process flow diagram of a preferred method for forming solder bumps of uniform height on a semiconductor wafer. The process flow diagram assumes that the underlying circuitry of the semiconductor wafer has been processed to the point where contact pads have been formed and exposed at the top layer of the semiconductor wafer. As is known in the art of flip chip technology, the contact pads form the next level electrical interconnection between each IC device and the outside world. An embodiment includes contact pads that are formed of aluminum.

In an embodiment, a UBM layer is deposited onto the top layer of the semiconductor wafer (Step 402). Examples of techniques used to deposit the UBM layer onto the semiconductor wafer include vapor deposition, sputtering, and electrolytic or electroless plating. Examples of the under bump metal layer include a stack of metals such as chrome/nickel, chrome/nickel/copper, chrome/nickel/gold, chrome/copper, titanium/nickel, titanium/nickel/copper, titanium/nickel/gold, and titanium/copper, where any of the metals may be a to metal alloy. Because the contact pads are exposed, the UBM layer comes into direct contact with the contact pads. After the UBM layer is deposited onto the semiconductor wafer, a layer of photoresist is deposited over the UBM layer (Step 404). Utilizing known photolithographic processes, the photoresist is then removed from above the contact pads and in a dummy pattern around the outer edge outline of the pattern of die (Step 406). In an embodiment, a single photolithographic mask is utilized to simultaneously define the contact pad areas and the dummy pattern.

Once the photoresist is removed from above the contact pads and in the dummy pattern, the UBM layer is exposed to ambient conditions in the areas above the contact pads and in the dummy pattern (Step 408). Although a process of exposing portions of an UBM layer is described, in an alternative embodiment, known semiconductor processing techniques are utilized to deposit the UBM layer only over the contact pads and in the dummy pattern around the outer edge outline of the pattern of die.

After the UBM layer is exposed in the areas above the contact pads and in the dummy pattern, solder material is plated onto the exposed UBM layer (Step 410) in order to form interconnect bumps above the contact pads. Specifically, the solder material is plated onto the exposed UBM that is above the contact pads and onto the dummy pattern of exposed UBM. In an embodiment, electrolytic plating is utilized to deposit the solder material onto the UBM layer although other processes are possible. In the electrolytic process, electrical current is conducted between an anode and a cathode, both of which are located within a plating bath. Conductive rods, preferably having the same composition as the plated solder, typically serve as the anode and the semiconductor wafer serves as the cathode. During the plating process, the solder material is simultaneously plated onto the areas of the UBM layer that are exposed over the contact pads and in the dummy pattern. The solder material may include, for example, lead solder or gold solder. Although solder material is described as the interconnect material, other interconnect materials may be plated onto the UBM in order to create conductive interconnects.

At some point after the solder material has been plated onto the exposed portions of the UBM layer, the remaining photoresist is removed from above the UBM layer (Step 412). Next, the UBM layer is selectively etched from the semiconductor wafer in the areas that are not covered by the solder material (Step 414). After the solder material has been plated onto the exposed UBM layer and the unplated UMB layer has been selectively etched, the solder material is put through a reflow process, as is known in the art, to create smooth solder bumps (Step 416). Alternatively, the selective etching of UBM may be performed after the solder reflow.

Because the dummy pattern of UBM is exposed around the outer edge outline of the pattern of die, during the electroplating process, current crowding occurs primarily at the dummy pattern and not at the contact pads of the outer edge die. Current crowding at the dummy pattern causes a thicker layer of solder material to be plated onto the dummy pattern of the exposed UBM layer. Because current crowding occurs at the dummy pattern instead of at the outer die, a relatively uniform current density is created across the pattern of die. As a result of the relatively uniform current density across the pattern of die, a relatively uniform layer of solder material is plated over the entire die pattern, even over the die at the outer edge outline of the pattern of die.

Referring back to FIG. 3, an embodiment of the UBM dummy pattern 306 includes a continuous strip of exposed UBM that is defined by the outer edge of the pattern of die 304, with the pattern of die being formed by the edges of the die that are not directly adjacent to other die on the same semiconductor wafer. In an embodiment, the continuous strip of exposed UBM is parallel to the outer edge outline of the pattern of die and is located close to the edge of each die in order to minimize current crowding at the outer die. Although FIG. 3 shows the dummy pattern as a strip of UBM, the dummy pattern can have other arrangements. In addition, although it is preferred that the dummy pattern follows the outline of the pattern of die, the dummy pattern may deviate from the outline of the pattern of die as long as the dummy pattern remains outside of the boundary of the die pattern outline. In particular, the dummy pattern may follow the die pattern outline and extend beyond it as long as the dummy pattern stays outside of the die pattern outline.

Referring to FIGS. 3 and 4, after the solder bumps have been created on the surface of the semiconductor wafer 302, the semiconductor wafer may be cut, as is known in the art, into individual die (Step 418). The semiconductor wafer is cut along dicing streets that are defined by the lines that separate the individual die. As is known in the art, dicing streets extend beyond the die pattern 304 to the edge of a semiconductor wafer. After the semiconductor wafer has been cut, the portions of the wafer that include the dummy pattern 306 of UBM and plated solder material may be discarded (Step 420). Because the dummy pattern of UBM is outside of the die pattern, it serves no purpose after the solder bumps have been created.

Figure 5:
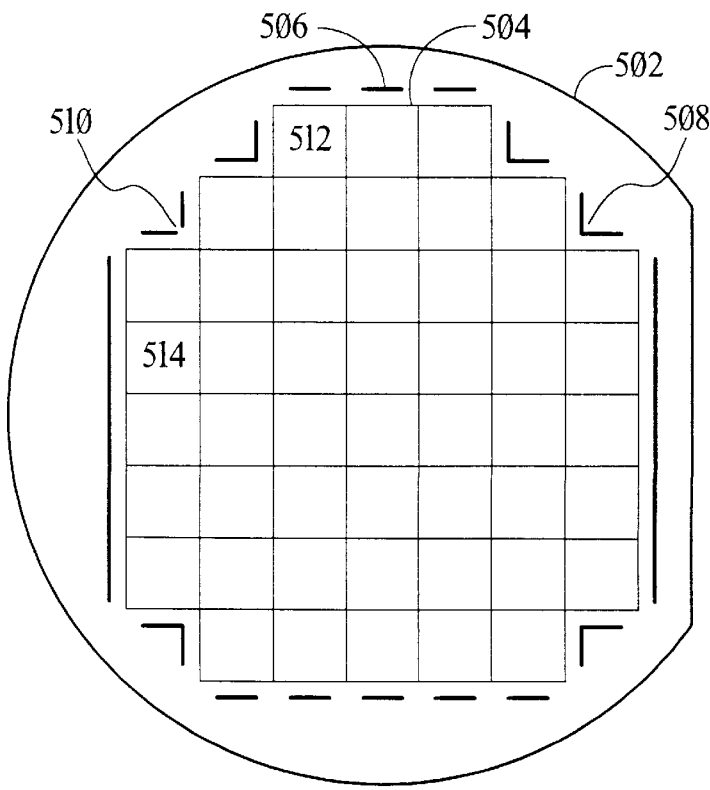
FIG. 5 is a plan view of a semiconductor wafer that includes an under bump metal layer formed in a dummy pattern around the outline of the pattern of die, with the dummy pattern being segmented at the dicing streets in accordance with the invention.

FIG. 5 is a plan view of a semiconductor wafer 502 in which the dummy pattern 506 of exposed UBM that surrounds the pattern of die 504 is segmented. The dummy pattern of exposed UBM is segmented such that the dicing streets are clear of any exposed UBM. Keeping the dicing streets clear of exposed UBM prevents solder from being plated in the dicing streets, thereby making it easier to cut the semiconductor wafer. As shown in FIG. 5, the dummy pattern of exposed UBM includes segments of exposed UBM that are parallel to the outer edge of the pattern of die. In one embodiment, an inner corner of the dummy pattern includes a continuous segment of exposed UBM next to the outer edge of two die, as shown at point 508, and in another embodiment, an inner corner of the dummy pattern includes two noncontinuous segments of UBM next to the outer edge of two die, as shown at point 510.

Figure 6:
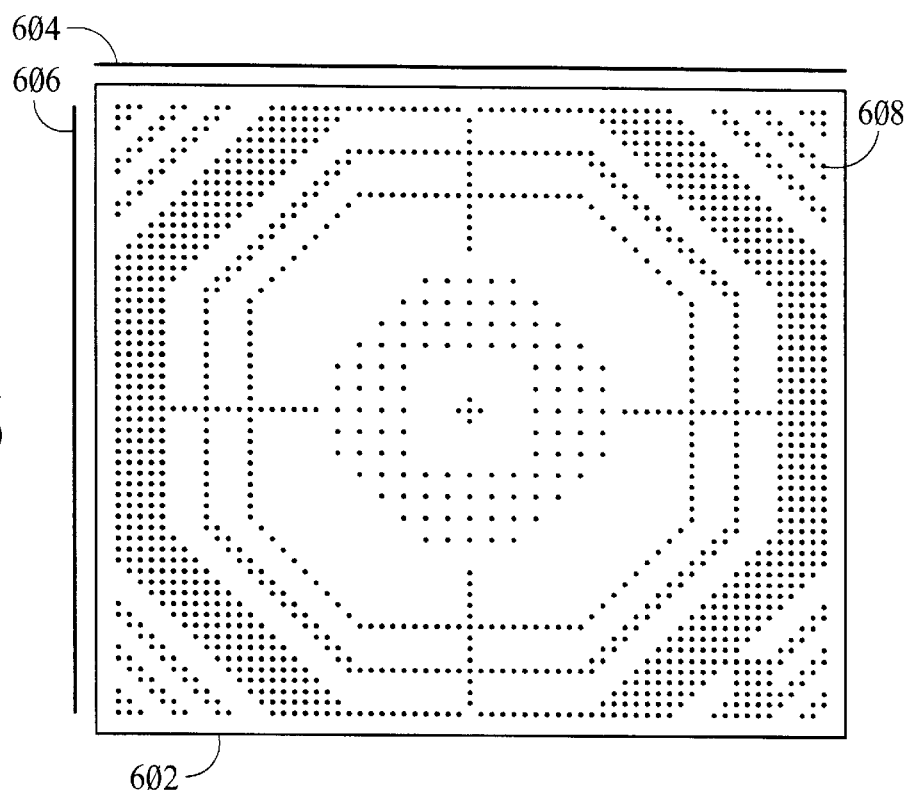
FIG. 6 is a depiction of a die that includes an example contact pad layout in relation to two segments of a dummy pattern of under bump metal.

FIG. 6 is a depiction of a single die 602 that includes an example contact pad layout in relation to two segments 604 and 606 of the dummy pattern of exposed UBM. The die shown in FIG. 6 may be located, for example, in an upper corner of a die pattern 504 as represented by die 512 in FIG. 5. As shown in FIG. 6, the two segments of exposed UBM are generally parallel to the edges of the die that include the outer edge of the pattern of to die. In an embodiment, the two segments of exposed UBM do not intersect the dicing streets that are in line with the edges of the die.

The contact pad layout on the die 602 in FIG. 6 represents an uneven distribution of contact pads 608. The uneven distribution of contact pads can create edge effects within each die causing a non-uniform thickness of solder is material to be plated onto the contact pads of each die. A judicious layout of contact pads helps to minimize the edge effects within each die.

Figure 7:
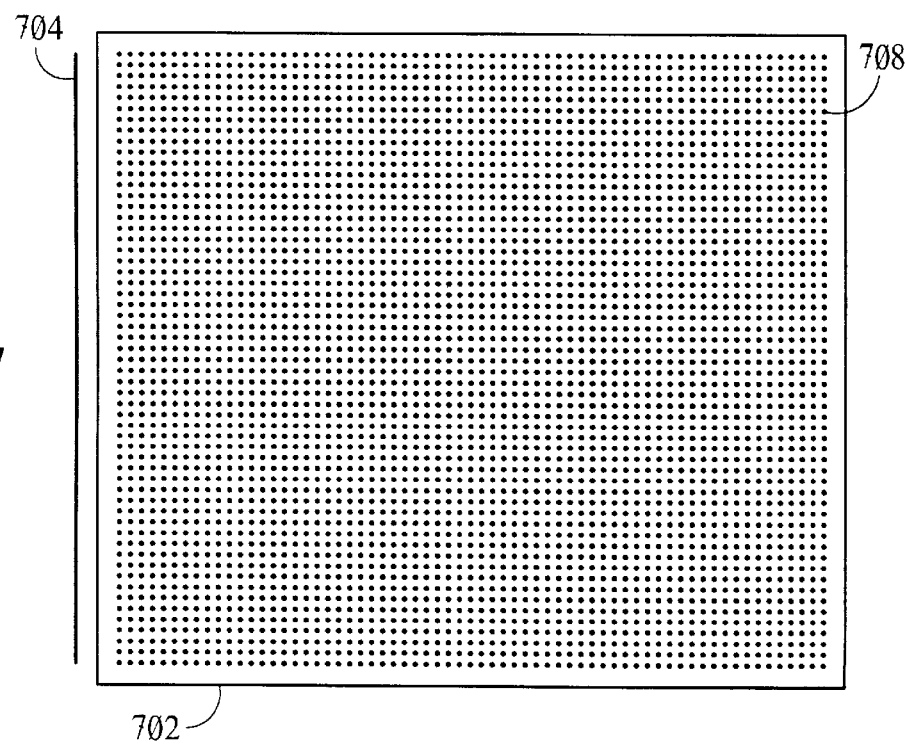
FIG. 7 is a depiction of a die that includes an example contact pad layout in relation to one segment of a dummy pattern of under bump metal.

FIG. 7 is a depiction of a single die 702 that includes an example contact pad layout in relation to one segment 704 of the dummy pattern of UBM. The die shown in FIG. 7 may be located, for example, on a side of a die pattern 504 as represented by die 514 in FIG. 5. The one segment of UBM as shown in FIG. 7 is generally parallel to an edge of the die that includes the outer edge of the die pattern. In an embodiment, the segment does not intersect the dicing streets that are in line with the edges of the die.

As shown in FIG. 7, the contact pads 708 are evenly distributed over the entire area of the die 702. Contact pads that are evenly distributed over each die help to minimize the edge effect within each die. In an embodiment, contact pads are evenly distributed over each die on a semiconductor wafer and a dummy pattern of exposed UBM is utilized as described with reference to FIGS. 3–5.

Although the pattern of die 304 in FIG. 3 shows die having a maximum of two edges that make up the outer edge of the pattern of die, a single die may be arranged such that it has three edges that make up the outer edge of the pattern of die. In addition, a single die can be surrounded on all sides by a dummy pattern of exposed UBM.

What is claimed is:

1. A method of processing a semiconductor wafer comprising the steps of:

exposing a metal layer above contact pads of a plurality of die that are present on a semiconductor wafer and in a dummy pattern around an outer edge outline of said plurality of die; and plating interconnect material onto said metal layer that is exposed above said contact pads and in said dummy pattern in order to form interconnect bumps above said contact pads.

2. The method of claim 1 further including a step of defining said dummy pattern as being completely outside of said plurality of die.

3. The method of claim 2 further including a step of defining said dummy pattern as including a segment of said exposed metal layer that is parallel to said outer edge outline of said plurality of die.

4. The method of claim 1 further including a step of defining said dummy pattern as a continuous strip that surrounds said plurality of die.

5. The method of claim 1 further including a step of defining said dummy pattern as segments that surround said plurality of die such that said segments do not intersect dicing streets of said semiconductor wafer.

6. The method of claim 1 further including a step of reflowing said interconnect material in order to create smooth interconnect bumps.

7. The method of claim 1 further including a step of cutting said semiconductor wafer along dicing streets in order to separate individual die.

8. The method of claim 7 further including a step of discarding portions of said semiconductor wafer that include said dummy pattern of said exposed metal layer.

9. The method of claim 1 wherein said metal layer is exposed simultaneously over said contact pads and in said dummy pattern.

10. The method of claim 9 wherein said interconnect material is electroplated simultaneously onto said metal layer that is exposed above said contact pads and onto said metal layer that is exposed in said dummy pattern.

11. A method for forming solder bumps of uniform height on integrated circuit devices comprising the steps of:

simultaneously exposing an under bump metal layer above contact pads of a plurality of die that are present on a semiconductor wafer and in a dummy pattern around an outer edge outline of said plurality of die;

simultaneously electroplating solder material onto said under bump metal layer that is exposed above said contact pads and in said dummy pattern;

reflowing said electroplated solder material in order to form solder bumps over said contact pads; and cutting said semiconductor wafer along dicing streets in order to separate individual die from said plurality of die.

12. The method of claim 11 further including a step of defining said dummy pattern as including non-continuous segments that do not intersect said dicing streets.

13. The method of claim 12 wherein said step of defining said dummy pattern includes defining said non-continuous segments as being parallel to said outer edge outline of said plurality of die.

14. The method of claim 13 wherein said step of defining said dummy pattern includes defining said non-continuous segments as being completely outside of said plurality of die.

\* \* \* \* \*